United States Patent [19]
Kernahan et al.

[11] Patent Number: 5,479,103
[45] Date of Patent: Dec. 26, 1995

[54] NON-LINEAR MEASURING METHOD USING CAPACITOR CHARGING TIMES AND CORRESPONDING STRUCTURE

[75] Inventors: Kent Kernahan, Cupertino; Gavin Grant, San Jose, both of Calif.

[73] Assignee: Air Communications, Inc., Sunnyvale, Calif.

[21] Appl. No.: 183,469

[22] Filed: Jan. 18, 1994

[51] Int. Cl.$^6$ ................................................. G01N 27/46
[52] U.S. Cl. ..................... 324/433; 324/677; 324/678; 340/636
[58] Field of Search ................................. 324/72.5, 658, 324/677, 678, 679, 705, 428, 433; 340/636

[56] References Cited

U.S. PATENT DOCUMENTS

| | | |
|---|---|---|
| 3,051,939 | 8/1962 | Gilbert . |
| 3,316,547 | 4/1967 | Ammann . |
| 4,058,808 | 11/1977 | Malaviya ............................. 324/99 D |
| 4,621,227 | 11/1986 | Venema ................................. 324/678 |
| 4,825,147 | 4/1989 | Cook et al. ............................ 324/684 |
| 4,866,389 | 9/1989 | Ryan et al. ............................ 324/433 |
| 5,099,209 | 3/1992 | Seki et al. ............................. 324/428 |

OTHER PUBLICATIONS

IBM Techical Disclosure Bulletin, entitled "Analog to Digital Converter" by C. H. Propster, Jr., vol. 5, No. 8, Jan. 1963, pp. 51–52.

*Primary Examiner*—Kenneth A. Wieder
*Assistant Examiner*—Christopher M. Tobin
*Attorney, Agent, or Firm*—Skjerven, Morrill, MacPherson, Franklin & Friel

[57] ABSTRACT

The value of an unknown voltage is measured by applying a time-varying current from a reference voltage source through a resistor to a capacitor thereby to increase the voltage across the capacitor as a function of time, measuring the time Tr required for the voltage across the capacitor to reach a selected reference voltage when current from the reference voltage source is applied to the capacitor, restoring the voltage across the capacitor to its initial state, applying a time varying current from an unknown voltage source through a resistor to the capacitor thereby to increase the voltage across the capacitor as a function of time, measuring the time Tb required for the voltage across the capacitor to reach a selected reference voltage when current from the unknown voltage source is applied to the capacitor and calculating the unknown voltage from the times Tr and Tb. The structure for implementing this process is controlled by a microprocessor and uses relatively low cost components compared to prior art dual slope voltage measuring structures.

17 Claims, 3 Drawing Sheets

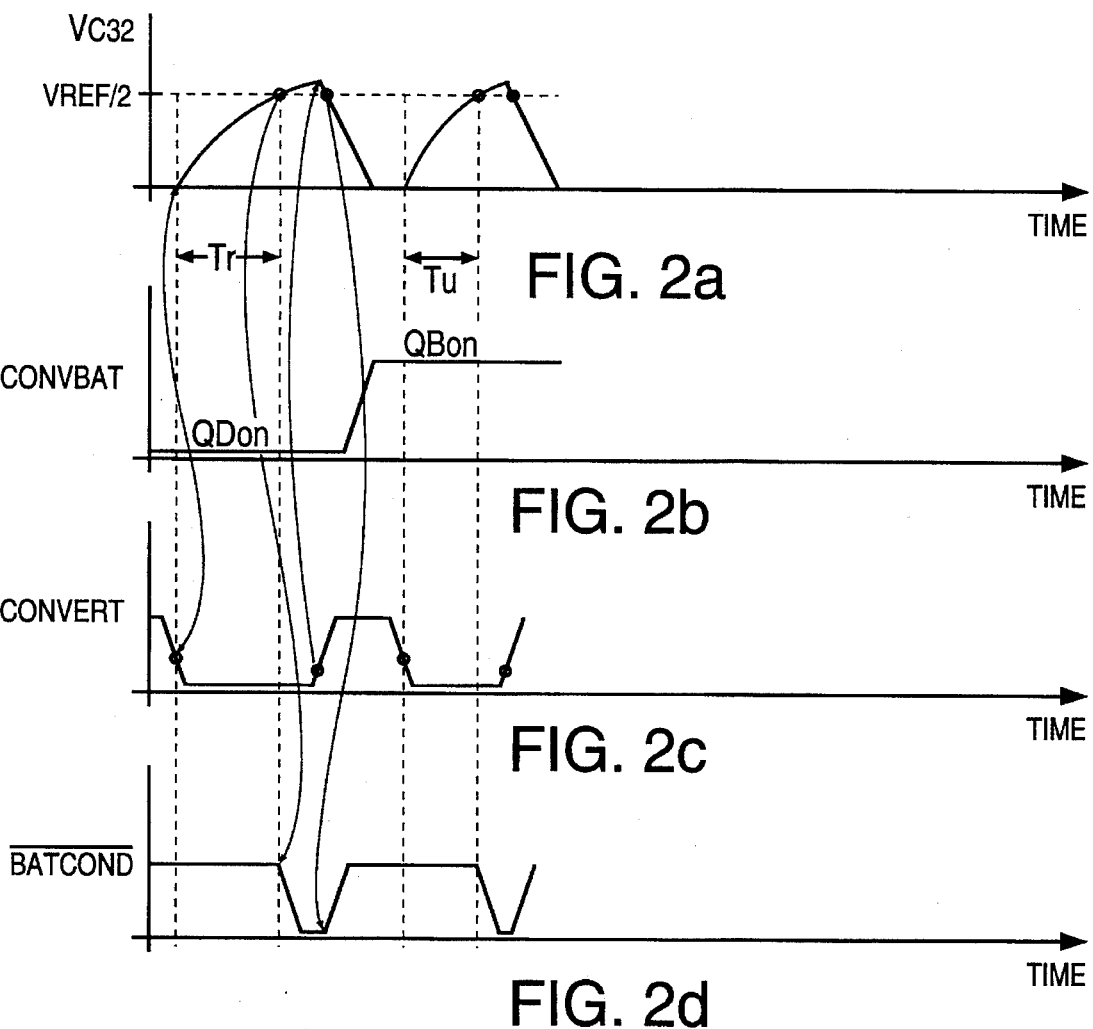

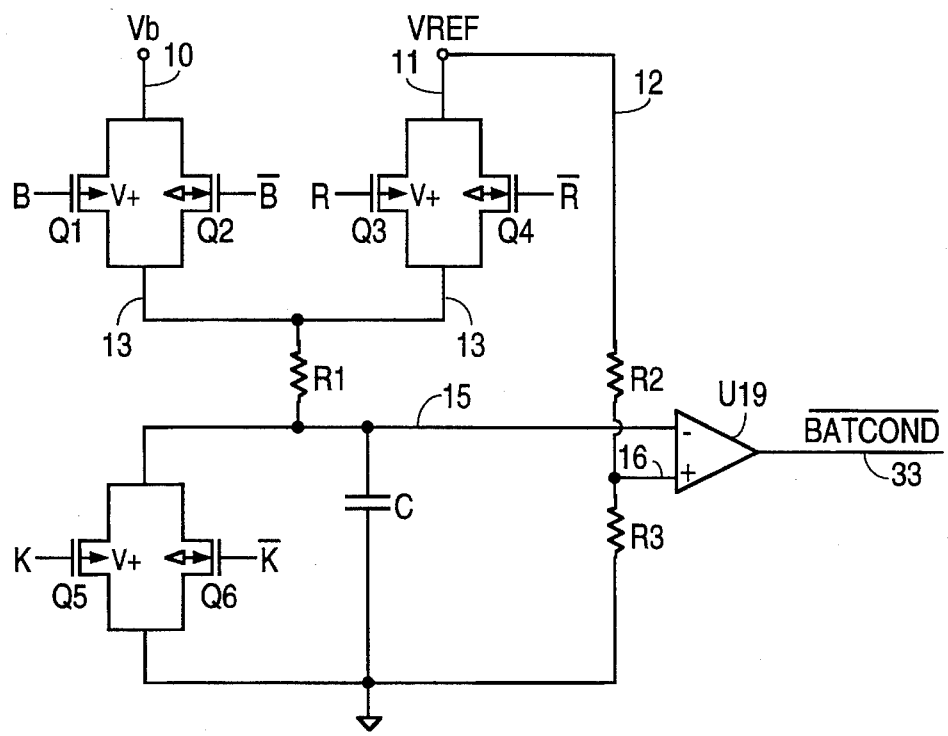
FIG. 3a
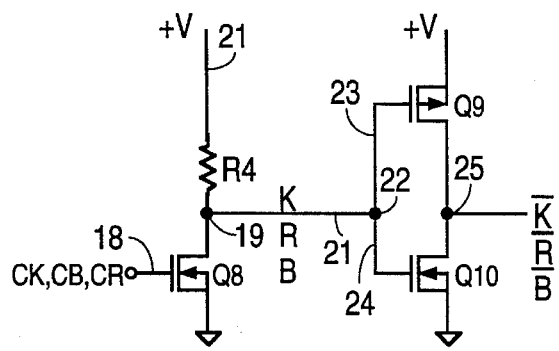
FIG. 3b
| CK | CB | CR | K | B | R | Mode |
|----|----|----|---|---|---|------|
| 1  | 0  | 0  | 0 | 1 | 1 | Stand by |
| 1  | 0  | 1  | 0 | 1 | 0 | Rdy REF |
| 0  | 0  | 1  | 1 | 1 | 0 | Measure REF |
| 1  | 1  | 0  | 0 | 0 | 1 | Rdy BAT |
| 0  | 1  | 0  | 1 | 0 | 1 | Measure BAT |
FIG. 3c 5,479,103

1

NON-LINEAR MEASURING METHOD USING CAPACITOR CHARGING TIMES AND CORRESPONDING STRUCTURE

FIELD OF THE INVENTION

This invention relates to the measurement of voltage and in particular to a non-linear structure and method for determining the value of an unknown voltage.

BACKGROUND OF THE INVENTION

The dual slope technique for determining the value of an unknown voltage involves charging a capacitor using an unknown but constant current derived from the unknown voltage for a fixed time and then measuring the time it takes to discharge the capacitor using a current derived from a known voltage. The ratio of the two times is a measure of the unknown voltage. Ammann in U.S. Pat. No. 3,316,547 discloses an integrating analog-to-digital converter using a dual slope technique as does Roswell Gilbert in U.S. Pat. No. 3,051,939. Propster in an article entitled "Analog to Digital Converter" published in IBM Technical Disclosure Bulletin Vol. 5, No. 8 dated January 1963 also discloses a version of the dual slope technique for measuring the value of an unknown voltage. Unfortunately, constant current sources necessary for the prior art dual slope voltage measurement structures and methods are quite expensive, particularly if the current source is linear over a range of voltages.

SUMMARY OF THE INVENTION

In accordance with this invention, the value of an unknown voltage is measured by using a non-constant time-varying current to charge a capacitor and measuring the times to charge the capacitor when a known and an unknown voltage are used sequentially as a source of the charging current. Structure and method are provided which require a minimum number of components, all inexpensive, and which yield the value of the unknown voltage with approximately the same accuracy as achieved with the prior art dual slope circuitry, but at much lower cost. The method and structure of this invention employ a non-linear relationship as opposed to the prior art linear relationship utilizing a constant current.

In accordance with this invention, a measure of an unknown voltage is derived by charging a capacitor using a time-varying current through a first resistor, the time-varying current being related to a known reference voltage, until a selected voltage is reached, measuring the time Tr necessary to achieve that selected voltage on the capacitor from a starting voltage on the capacitor, discharging the capacitor back to its starting voltage, and then measuring the time Tb to charge the capacitor to the same selected voltage using a current driven by the unknown voltage through a second resistor (identical to the first resistor). The time Tb necessary for the voltage on the capacitor to reach the selected voltage is a measure of the unknown voltage. The relationship between the known and the unknown voltage is obtained from a non-linear equation where the ratio of the times Tb/Tr allows the unknown voltage to be calculated.

In one embodiment of this invention, the unknown voltage is calculated by a microprocessor which has been programmed to measure the times Tr and Tb necessary to achieve the selected voltage when the known and the unknown voltages, respectively, are applied. The microprocessor then calculates the value of the unknown voltage from the measured times Tr and Tb and the known voltage.

The order in which the times Tb and Tr are obtained is unimportant.

In one embodiment, the microprocessor utilizes floating point capability.

A benefit of this invention is a major cost savings in hardware.

This invention will be more fully understood in light of the following detailed description taken together with the drawings.

DRAWINGS

FIGS. 2a, 2b, 2c and 2d illustrate wave forms of use in explaining the operation of the circuitry of FIG. 1 with each arrow showing the relationship of the trigger point on one waveform to a change in another waveform.

FIGS. 3a, 3b and 3c illustrate a second embodiment of this invention.

DETAILED DESCRIPTION

Figure 1:
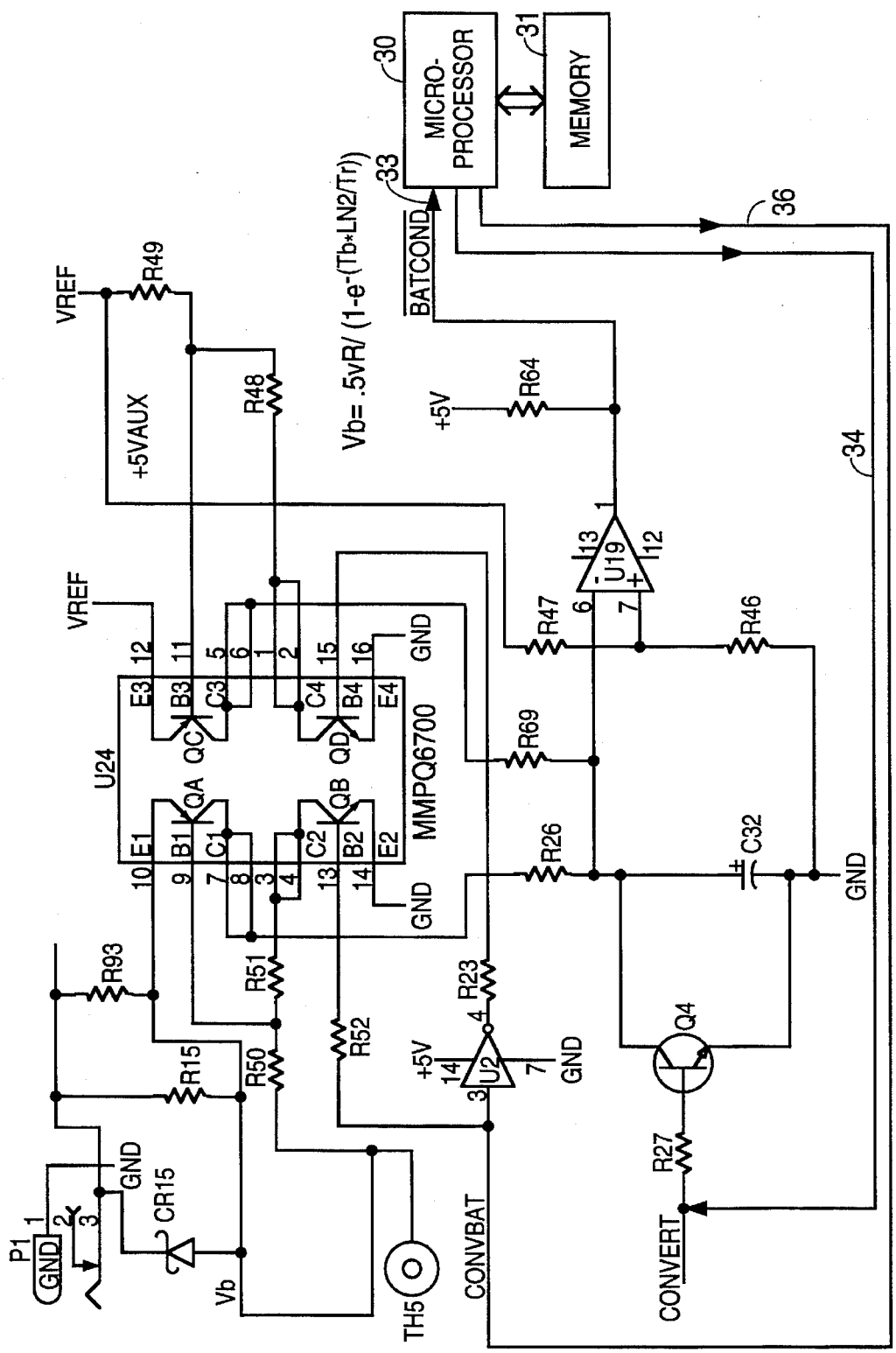
FIG. 1 illustrates the circuitry of one embodiment of this invention used to measure the value of an unknown voltage.

FIG. 1 illustrates one embodiment of this invention. In FIG. 1, capacitor C32 has one terminal connected to a reference voltage such as ground and to the emitter of bypass NPN transistor Q4 and the other terminal connected to the collector of bypass NPN transistor Q4 and through resistor R26 to the collector of PNP transistor QA. This other terminal of capacitor C32 is also connected through resistor R69 (which is as close to identical to resistor R26 as can reasonably be achieved) to the collector of PNP transistor QC.

When transistor Q4 is on and saturated, the voltage across capacitor C32 is held to approximately zero which is the starting voltage for the method of this invention. Comparator U19, the inverting input lead of which is connected to the collector of NPN transistor Q4 and the non-inverting input lead of which is connected to the midpoint on voltage divider R46 and R47 connected between VREF and ground, produces a high output signal $\overline{BATCOND}$ when transistor Q4 is on and the collector of Q4 is at approximately ground. When NPN transistor Q4 is turned off, then capacitor C32 is capable of storing charge.

One function of the circuit shown in FIG. 1 is to periodically or aperiodically monitor the output voltage =Vb from a battery and provide information to allow a microprocessor to calculate and display the expected battery life so a user can replace a battery before it fails. Of course, the circuitry of this invention can be used to monitor the voltages from a number of different types of sources for any of a number of purposes, such as providing a digital display of the voltage, or activating a control circuit or driving a volt meter.

As shown in FIG. 1, a reference voltage VREF (typically supplied by a well-known band gap reference source which provides a reference voltage determined by the voltage across one or more series-connected PN junctions and which is therefore relatively insensitive to battery voltage) is provided in a standard well known manner. Any well known reference voltage source can be used in accordance with this invention. The selected reference voltage on non-inverting input lead 7 of comparator U19 is merely that voltage at the node between resistor R46 and resistor R47. These two resistors preferably are equal in magnitude in which case the voltage on lead 7 is VREF/2.

To start the operation of the circuit of FIG. 1, NPN control transistor QD is turned on by a high voltage on its base through resistor R23 from inverter U2 in response to a low input signal CONVBAT (FIG. 2b). When transistor QD turns on, a current from the reference voltage source VREF passes through resistor R49 thereby placing a voltage on the base of PNP transistor QC, the emitter of which is at the reference voltage. The base of transistor QC, when QC is on, is held at approximately 0.7 volts beneath VREF. The current through resistor R48 and transistor QD to ground is approximately the base current of transistor QC. This current causes transistor QC to turn on and saturate. The collector current from PNP transistor QC passes through resistor R69. When NPN transistor Q4 is on, this current becomes the collector current of NPN transistor Q4. When transistor Q4 is off, this current charges capacitor C32.

To start the measurement of the unknown voltage, microprocessor 30 produces a low output signal CONVERT on lead 34 (FIG. 2c) which turns off transistor Q4. Microprocessor 30 is programmed to measure the time from the start of the charging of capacitor C32 when the signal CONVERT goes low thereby turning off transistor Q4 and thus allowing charge to accumulate on capacitor C32 until the voltage across capacitor C32 equals VREF/2.

After the current from transistor QC is passed through resistor R69 as a result of transistor QD turning on in response to the signal CONVBAT going low, the signal CONVERT (FIG. 2c) goes low thereby turning off transistor Q4 and allowing capacitor C32 to charge. Capacitor C32 charges thereby increasing the voltage VC32 on inverting input lead 6 to comparator U19 in accordance with equation (1).

$$VC32 = VREF(1 - e^{-Tr/R69C32}) \quad (1)$$

where t is the elapsed time since the signal CONVERT went low.

When the voltage on capacitor C32 and thus on lead 6 to comparator U19 reaches the voltage VREF/2 applied to the non-inverting lead 7 of comparator U19, the output signal $\overline{BATCOND}$ (FIG. 2d) of the comparator U19 switches from high to low. This output signal is transmitted on lead 33 to microprocessor 30 which measures, in a well known manner using an internal counter, the time Tr necessary for the voltage on capacitor C32 to reach the selected voltage VREF/2 on non-inverting input lead 7 of comparator U19 from the time the signal CONVERT (FIG. 2c) goes low. Microprocessor 30 then causes this time Tr to be stored in memory 31 in a well-known manner.

Then, a high level signal CONVERT (FIG. 2c) from microprocessor 30 is applied to the base of transistor Q4 via lead 34 for a short time thereby to discharge capacitor C32 as shown in FIG. 2a. Of interest, capacitor C32 can continue to charge after VC32 reaches VREF/2 as shown in FIG. 2a until transistor Q4 is turned on to discharge capacitor C32. A short delay in turning on Q4 after the voltage VC32 reaches VREF/2 is not important.

While CONVBAT is high, the signal CONVBAT (FIG. 2b) goes high, thereby shutting off NPN control transistor QD and applying a high level signal through resistor R52 to the base of NPN control transistor QB thereby turning on QB. This allows a current to flow from the battery, the voltage Vb of which is to be determined, through a voltage divider made up of equal valued resistors R50 and R51, thereby turning on and saturating PNP transistor QA.

Following the high level CONVERT pulse, which typically lasts approximately 10 to 100 microseconds but which can last any other appropriate time, the signal CONVERT (FIG. 2c) on lead 34 is driven low by microprocessor 30 thereby shutting off transistor Q4. The current through PNP transistor QA is then applied to capacitor C32 through resistor R26 (intended to be equal in value to resistor R69) thereby to charge capacitor C32 to a voltage VC32 given by:

$$VC32 = Vb(1 - e^{-Tb/R26C32}) \quad (2)$$

Where again, t is the elapsed time since the signal CONVERT went low. The microprocessor 30 measures the time Tb necessary for the voltage on capacitor C32 to reach VREF/2. Microprocessor 30 then causes this time to be stored in memory 31 and uses this time as described below to calculate the value of the battery voltage. This battery voltage, together with other battery voltage measurements, is then used to predict the remaining lifetime of the battery in accordance with an algorithm appropriate to the battery type. Should the actual battery voltage be beneath the minimum desired battery voltage, an alarm (such as a blinking light or symbol) can be sounded (by a separate circuit, not shown) thereby allowing the user to change the battery before it fails.

During the time that NPN transistor Q4 is turned on to discharge capacitor C32 between the measurement of the time Tr and the measurement of the time Tb (i.e., when CONVERT (FIG. 2c) is high, NPN transistor Q4 also allows current flowing through either resistor R26 or R69 to pass through transistor Q4 to ground while clamping the voltage across capacitor C32 to the collector voltage on saturated transistor Q4. During saturation, the collector voltage of Q4 is close to zero and is a predictable, repeatable value. Thus, the voltage across capacitor C32 and on inverting input lead 6 to comparator U19 always returns rapidly to a known and repeatable initial value (i.e. the starting voltage) whenever transistor Q4 turns on and saturates.

Microprocessor 30 calculates the battery voltage Vb (which is the unknown voltage) using equation (3) below which is derived from the well-known equations (1) and (2) for the voltage across an RC network.

The ratio of the time required to charge capacitor C32 to the voltage VREF/2 when the unknown voltage Vb (i.e., in one embodiment, the battery voltage) is applied to provide a time-varying current to charge capacitor C32 to the time required to charge capacitor C32 to the voltage VREF/2 when the reference voltage VREF is applied to provide a time-varying current to charge capacitor C32 is known from the times Tb and Tr measured and stored by microprocessor 30. Therefore, the unknown voltage Vb can be calculated from the following equation.

$$Vb = (\tfrac{1}{2})VREF/(1 - e^{-ln2(Tb/Tr)}) \quad (3)$$

In equation (3) the values of the resistors R26 and R69 and of capacitor C32 are irrelevant, having cancelled out. While theoretically it would be possible to determine the value of the unknown voltage Vb merely from the measurement of the time Tb in equation (2) knowing the values of resistor R26 and capacitor C32 and the value of the voltage VC32 across capacitor 32 at the time Tb, unfortunately the uncertainties in resistor R26 and capacitor C32 reflecting the inability to precisely measure the values of these components are such that the resulting calculated voltage Vb would be not sufficiently accurate for the intended purposes. Accordingly, as equation (3) shows, the actual values of R26, R69 and C32 are unimportant because these parameters cancel out when the times to charge capacitor C32 using both a known voltage and an unknown voltage are measured. Because the times Tr and Tb can be measured more precisely than the values of resistors R26, R69 and capacitor C32, a major increase in accuracy is achieved with this invention.

The elimination of the values of resistors R26 and capacitor C32 from the calculation of Vb yields another advantage. Even though the values of resistors and capacitors can be measured fairly accurately, the actual values of resistors and capacitors change with temperature. Compensation for temperature changes is difficult and expensive. Accordingly, this invention avoids the compensation circuitry to do this and thus the associated expense by measuring the times required to charge the capacitor C32 to a given reference voltage using a current derived from a known reference voltage source and a current derived from the unknown voltage source. The measurement of time can be done accurately over a range of temperatures and a reference voltage such as VREF can be generated accurately over a range of temperatures. The microprocessor can easily be programmed to perform this calculation in real time. In the preferred embodiment, a microprocessor such as the 68302, a 386 or a 486, for example, can be used for this calculation. The implementation in software of equation (3) is well within the ability of one of ordinary skill in programming and thus a specific program to implement equation (3) will not be discussed in detail.

Of interest, resistors R26 and R69 can be replaced by one resistor of the same value if VREF is greater than Vb. The problem with using a single resistor in the circuitry as shown in FIG. 1 is that then a current path will exist from the battery at voltage Vb through transistor QA and then through the collector-base PN junction of transistor QC to VREF when VREF is more than approximately 0.7 volts (the voltage drop across a forward biased PN junction) beneath Vb. To prevent the battery from being discharged by current flowing through this path, the circuit of FIG. 1 uses two resistors R26 and R69 connected to the inverting input lead 6 of comparator U19. The inverting input lead 6 of comparator U19 is always beneath approximately VREF/2 and therefore no current path exists from the battery through R26 and R69 to VREF.

Note that the circuit of FIG. 1, as shown, always has one of NPN transistors QB and QD on. Thus, current is always flowing from either VREF or Vb through NPN transistor Q4 to ground. This drains the battery. If desired, a separate switching transistor can be connected between the base of either QB or QD to ground thereby to shut off this transistor in response to a separate control signal when the other of these two transistors is shut off.

FIGS. 3a, 3b and 3c illustrate a second embodiment of this invention. For simplicity, microprocessor 30 and memory 31 are not shown in FIG. 3a, but it should be understood that the circuit of FIG. 3a can be used with these components in a manner similar to that shown in FIG. 1. As shown in FIG. 3a, a battery voltage Vb is applied through terminal 10 to the source of P-channel transistor Q1 and to the drain of N-channel transistor Q2. The drain of P-channel Q1 is connected to lead 13 as is the source of N-channel transistor Q2. Parallel-connected transistors Q1 and Q2 function as a switching network. An identical switching network, made up of parallel-connected P-channel transistor Q3 and N-channel transistor Q4, is connected between terminal 11, to which is applied a reference voltage VREF, and terminal 13 which is connected to one lead of resistor R1. The other lead of resistor R1 is connected to lead 15 which is connected to one lead of capacitor C. The other lead of capacitor C is connected to a reference voltage, shown as ground but which could be any other appropriate reference voltage. Parallel-connected P-channel transistor Q5 and N-channel transistor Q6 are connected between lead 15 and ground and function as a switch which when on prevents capacitor C from charging and which when off allows capacitor C to charge in response to current flowing through resistor R1.

FIG. 3b illustrates the structure generating the control signals K, B and R used to operate the structure of FIG. 3a. In FIG. 3b, control signal CK is applied to the gate 18 of N-channel transistor Q8 the source of which is connected to a reference voltage, shown as ground, and the drain of which is connected to node 19. The substrate of transistor Q8 is held at the reference voltage shown as ground. Node 19 is also connected to resistor R4, typically a polycrystalline load resistor but which could also be any other appropriate load.

Node 19 is connected by lead 21 to node 22 from which leads 23 and 24 supply the voltage on node 22 directly to the gates of P-channel transistor Q9 and N-channel transistor Q10, respectively. The substrate of P-channel transistor Q9 is held at +V while the substrate of N-channel transistor Q10 is held at the reference voltage, shown as ground. Accordingly, when the control signal CK applied to gate 18 goes high, N-channel transistor Q8 turns on pulling the voltage on node 19 to the reference voltage shown as ground. The voltage on node 19 is also applied by lead 21, node 22 and leads 23 and 24 to the gates of P-channel transistor Q9 and N-channel transistor Q10. In response to this voltage going low, P-channel transistor Q9 turns on and N-channel transistor Q10 turns off, thereby driving the voltage on node 25 to the high level voltage +V. Accordingly, signal K is low level and $\overline{K}$ is high level.

Circuits substantially identical to the circuit shown in FIG. 3b are also used to generate the signals B and $\overline{B}$ and R and $\overline{R}$. Accordingly, the circuit of FIG. 3b should be understood to be replicated three times to generate the three different control signals K, B and R and their complements. For simplicity however, only the structure of FIG. 3b is shown in the drawings.

FIG. 3c illustrates the truth table for the signals K, B and R and the mode adopted by the circuitry in FIG. 3a for each of the states shown in FIG. 3c for the signals K, B and R. Thus, when the signal K, applied to the gate of P-channel transistor Q5 is low, the signal $\overline{K}$, applied to the gate of N-channel transistor Q6 is high, and transistors Q5 and Q6 are on, clamping the voltage across capacitor C to approximately zero, the starting voltage. If the signals B and R are both high, then transistors Q1 and Q2, and Q3 and Q4 are off and the circuit of FIG. 3a is in standby mode. Note that during standby, current flows through the voltage divider made up of resistors R2 and R3 to apply a selected signal to the non-inverting input lead 16 of inverter U19.

To get ready to measure the time necessary to charge capacitor C to the reference level voltage VREF/2 (in the preferred embodiment resistors R2 and R3 are equal in value) on lead 16 to inverter U19, the input signal B stays high thereby holding off transistors Q1 and Q2. Simultaneously, the signal R goes low (K is already low in the standby mode) thereby turning on P-channel transistor Q3 and N-channel transistor Q4. P-channel transistor Q5 and N-channel transistor Q6 are still on from the standby mode. Current then flows from the source of reference voltage VREF on lead 11 through parallel-connected P-channel transistor Q3 and N-channel transistor Q4 to lead 13, then through resistor R1 and through P-channel transistor Q5 and N-channel transistor Q6 to ground.

To obtain a measure Tr of the voltage VREF, the signal K is driven high. P-channel transistor Q5 and N-channel transistor Q6 are held off, respectively, by the high level signal K and its complement $\overline{K}$. The current through resistor R1 then charges capacitor C exponentially until the voltage on the inverting input lead 15 to comparator U19 matches the reference voltage on non-inverting input lead 16 to comparator U19. When the voltage on lead 15 matches the voltage on lead 16 at time Tr (FIG. 2a), the output signal $\overline{BATCOND}$ (FIG. 2d) from comparator U19 changes state by going low. This change of state is detected by microprocessor 30 (FIG. 1) via lead 33 which then causes a measure of the time Tr to be stored in memory 31. This storage of the time Tr is done in a well-known manner and thus the circuitry and software to cause this to be done will not be described in detail.

In the preferred embodiment, resistors R2 and R3 (FIG. 3a) are equal in value thereby insuring that the selected reference voltage on non-inverting input lead 16 to comparator U19 is VREF/2. After the voltage across capacitor C on lead 15 equals the reference voltage VREF/2 on non-inverting input lead 16 to comparator U19 and comparator U19 produces the signal $\overline{BATCOND}$ which causes microprocessor 30 to measure the time Tr required for the voltage across capacitor C to reach the selected reference voltage, microprocessor 30 causes the signal K to be driven low again (i.e. CK which corresponds to CONVERT in FIG. 2c is driven high). This turns on P-channel transistor Q5 and N-channel transistor Q6 and thus drops the voltage across capacitor C back to its normal low starting voltage close to ground.

Preferably, simultaneously with the change in state of the signal K from high to low, the signal B changes from high to low (i.e. CB goes from low to high) and the signal R changes from low to high (i.e. CR goes high to low) thereby to ready for operation the battery voltage measuring portion of the circuit in FIG. 3a. With the transition of signal B low and signal R high, current now flows through P-channel transistor Q1 and N-channel transistor Q2 to lead 13 and then through resistor R1 and because the signal K is low, through parallel-connected P-channel transistor Q5 and N-channel transistor Q6 to ground. Because signal R is high, no current flows through P-channel transistor Q3 and N-channel transistor Q4.

However, when the signal K is next driven high (i.e. CK or CONVERT (FIGS. 2c and 3c) is driven low), the current through resistor R1 no longer can pass through parallel-connected P-channel transistor Q5 and N-channel transistor Q6 but rather must charge capacitor C. Thus, the voltage across capacitor C rises exponentially. When this voltage, applied to the inverting input lead 15 of comparator U19, reaches the selected reference voltage VREF/2 on non-inverting input lead 16 to comparator U19, the output signal from comparator U19 changes state and microprocessor 30 again measures the time Tb for the voltage across capacitor C to reach VREF/2. This time Tb is then used by the microprocessor in an application program to solve equation (3) above to determine the battery voltage Vb from the times Tr and Tb.

The operation of the circuitry of FIGS. 1 and 3a assumes that the voltage +V is equal to or greater than the battery voltage Vb and is also equal to or greater than the reference voltage VREF. In addition, the circuitry operates correctly when the voltage Vb is substantially greater than the threshold voltage Vt of the MOS transistors Q1 to Q10 shown in FIGS. 3a and 3b.

In the structure of FIG. 1 and FIG. 3a, the voltage Vb should be somewhat larger than the voltage VREF/2. As Vb approaches VREF/2, the time necessary to determine the value of Vb becomes much larger and in the limit approaches infinity as Vb approaches closely VREF/2.

Table 1 gives the preferred values and tolerances thereon of the components used in the circuit of FIG. 1.

TABLE 1

| Values of Components in FIG. 1 | |
|---|---|
| QA | MMPQ6700 |
| QB | MMPQ6700 |
| QC | MMPQ6700 |
| QD | MMPQ6700 |
| Q4 | MMBT2369ALT1 |
| CR15 | MBRS140T3 |
| U2 | 74HC04 |
| U19 | LP339M |
| R15 | 267 |
| R23 | 5.1K ± 5% |
| R26 | 100K ± 1% |
| R27 | 5.1K ± 5% |
| R46 | 100K ± 1% |
| R47 | 100K ± 1% |
| R48 | 49.9K ± 5% |
| R49 | 348K ± 5% |
| R50 | 20K ± 5% |
| R51 | 20K ± 5% |
| R52 | 5.1K ± 5% |
| R64 | 10K ± 5% |
| R69 | 100K ± 1% |
| R93 | 267 |
| C32 | 1 μF 16V |

The above description is meant to be illustrative only and not limiting. Other embodiments of this invention will be obvious to those skilled in the art in view of this disclosure.

We claim:

1. A method for measuring the value of an unknown voltage which comprises:

applying a time-varying current from a reference voltage source through a first resistor to a capacitor thereby to increase the voltage across said capacitor as a function of time;

measuring the time Tr required for the voltage across said capacitor to reach a selected voltage level when current from the reference voltage source is applied to said capacitor;

restoring the voltage across said capacitor to its initial state;

applying a time-varying current from an unknown voltage source through a second resistor, whose resistance is equal to that of said first resistor, to said capacitor thereby to increase the voltage across said capacitor as a function of time;

measuring the time Tb required for the voltage across said capacitor to reach said selected voltage level when current from the unknown voltage source is applied to said capacitor; and calculating the unknown voltage from the times Tr and Tb, wherein said first resistor connected between said reference voltage source and said capacitor and said second resistor connected between said unknown voltage source and said capacitor comprise two distinct resistors.

2. A structure for measuring the value of an unknown voltage which comprises:

a capacitor the voltage across which can be held in an initial state;

structure for applying a time-varying current from a reference voltage source through a first resistor to said capacitor thereby to increase the voltage across said capacitor as a function of time;

structure for measuring the time Tr required for the voltage across said capacitor to reach a selected voltage level from its initial state when current from the reference voltage source is applied to said capacitor;

structure for restoring the voltage across said capacitor to, and for holding the voltage across said capacitor at, its initial state;

structure for applying a time-varying current from an unknown voltage source through a second resistor, whose resistance is equal to that of said first resistor, to said capacitor thereby to increase the voltage across said capacitor as a function of time;

structure for measuring the time Tb required for the voltage across said capacitor to reach said selected voltage level from its initial state when current from the unknown voltage source is applied to said capacitor; and structure for calculating the unknown voltage from the times Tr and Tb, respectively, required for the voltage across the capacitor to reach the selected voltage level in response to the current from the reference voltage source and in response to the current from the unknown voltage source, wherein said structure for applying a time-varying current from an unknown voltage source through a second resistor to said capacitor comprises:

a first transistor for drawing a current from said unknown voltage source through a third resistor and a fourth resistor, thereby to create a voltage drop across said third resistor; and a second transistor which is turned on in response to the voltage drop across said third resistor, for drawing said time-varying current from said unknown voltage source, said current from said unknown voltage source being passed through said second resistor to said capacitor.

3. A structure for measuring the value of an unknown voltage which comprises:

a capacitor the voltage across which can be held in an initial state;

structure for applying a time-varying current from a reference voltage source through a first resistor to said capacitor thereby to increase the voltage across said capacitor as a function of time;

structure for measuring the time Tr required for the voltage across said capacitor to reach a selected voltage level from its initial state when current from the reference voltage source is applied to said capacitor;

structure for restoring the voltage across said capacitor to, and for holding the voltage across said capacitor at, its initial state;

structure for applying a time-varying current from an unknown voltage source through a second resistor, whose resistance is equal to that of said first resistor, to said capacitor thereby to increase the voltage across said capacitor as a function of time;

structure for measuring the time Tb required for the voltage across said capacitor to reach said selected voltage level from its initial state when current from the unknown voltage source is applied to said capacitor; and structure for calculating the unknown voltage from the times Tr and Tb, respectively, required for the voltage across the capacitor to reach the selected voltage level in response to the current from the reference voltage source and in response to the current from the unknown voltage source, wherein the structure for applying a time-varying current from a reference voltage source through a first resistor to said capacitor comprises a first transistor for drawing a current from the reference voltage source through a third resistor and a fourth resistor, thereby to create a voltage drop across said third resistor;

a second transistor which is turned on in response to the voltage drop across said third resistor, for drawing said time-varying current from the reference voltage source, said current from said reference voltage source being passed through said first resistor to said capacitor.

4. Structure as in claim 3 wherein said structure for restoring the voltage across said capacitor to, and for holding the voltage across said capacitor at, its initial state comprises:

at least one switching transistor connected across said capacitor, said at least one switching transistor when on holding the voltage across said capacitor at its initial state and when off allowing the voltage across said capacitor to increase as charge is applied to said capacitor.

5. A structure for measuring the value of an unknown voltage which comprises:

a capacitor the voltage across which can be held in an initial state;

structure for applying a time-varying current from a reference voltage source through a first resistor to said capacitor thereby to increase the voltage across said capacitor as a function of time;

structure for measuring the time Tr required for the voltage across said capacitor to reach a selected voltage level from its initial state when current from the reference voltage source is applied to said capacitor;

structure for restoring the voltage across said capacitor to, and for holding the voltage across said capacitor at, its initial state;

structure for applying a time-varying current from an unknown voltage source through a second resistor, whose resistance is equal to that of said first resistor, to said capacitor thereby to increase the voltage across said capacitor as a function of time;

structure for measuring the time Tb required for the voltage across said capacitor to reach said selected voltage level from its initial state when current from the unknown voltage source is applied to said capacitor; and structure for calculating the unknown voltage from the times Tr and Tb, respectively, required for the voltage across the capacitor to reach the selected voltage level in response to the current from the reference voltage source and in response to the current from the unknown voltage source, wherein said structure for applying a time-varying current from an unknown voltage source through said second resistor to said capacitor thereby to increase the voltage across said capacitor as a function of time comprises:

a P-channel transistor and an N-channel transistor connected in parallel between said unknown voltage source and said second resistor thereby to allow said time-varying current from said unknown voltage source to pass through said second resistor to said capacitor.

6. A structure for measuring the value of an unknown voltage which comprises:

a capacitor the voltage across which can be held in an initial state;

structure for applying a time-varying current from a reference voltage source through a first resistor to said capacitor thereby to increase the voltage across said capacitor as a function of time;

structure for measuring the time Tr required for the voltage across said capacitor to reach a selected voltage level from its initial state when current from the reference voltage source is applied to said capacitor;

structure for restoring the voltage across said capacitor to, and for holding the voltage across said capacitor at, its initial state;

structure for applying a time-varying current from an unknown voltage source through a second resistor, whose resistance is equal to that of said first resistor, to said capacitor thereby to increase the voltage across said capacitor as a function of time;

structure for measuring the time Tb required for the voltage across said capacitor to reach said selected voltage level from its initial state when current from the unknown voltage source is applied to said capacitor; and structure for calculating the unknown voltage from the times Tr and Tb, respectively, required for the voltage across the capacitor to reach the selected voltage level in response to the current from the reference voltage source and in response to the current from the unknown voltage source, wherein said structure for applying a time-varying current from a reference voltage source through a first resistor to said capacitor, thereby to increase the voltage across said capacitor as a function of time comprises a P-channel transistor and an N-channel transistor connected in parallel between said reference voltage source and said first resistor thereby to allow said time-varying current from said reference voltage source to pass through said first resistor to said capacitor.

7. Structure as in claim 6 wherein said first resistor connected between said reference voltage source and said capacitor and said second resistor connected between said unknown voltage source and said capacitor comprise a single resistor.

8. A structure for measuring the value of an unknown voltage which comprises:

a capacitor the voltage across which can be held an initial state;

structure for applying a time-varying current from a reference voltage source through a first resistor to said capacitor thereby to increase the voltage across said capacitor as a function of time;

structure for measuring the time Tr required for the voltage across said capacitor to reach a selected voltage level from its initial state when current from the reference voltage source is applied to said capacitor;

structure for restoring the voltage across said capacitor to, and for holding the voltage across said capacitor at, its initial state;

structure for applying a time-varying current from an unknown voltage source through a second resistor, whose resistance is equal to that of said first resistor, to said capacitor thereby to increase the voltage across said capacitor as a function of time;

structure for measuring the time Tb required for the voltage across said capacitor to reach said selected voltage level from its initial state when current from the unknown voltage source is applied to said capacitor; and structure for calculating the unknown voltage from the times Tr and Tb, respectively, required for the voltage across the capacitor to reach the selected voltage level in response to the current from the reference voltage source and in response to the current from the unknown voltage source, wherein said first resistor connected between said reference voltage source and said capacitor and said second resistor connected between said unknown voltage source and said capacitor comprise two distinct resistors.

9. Structure as in claim 7 wherein said structure for restoring the voltage across said capacitor to, and for holding the voltage across said capacitor at, its initial state comprises a P-channel transistor and an N-channel transistor connected in parallel with each other and said capacitor and in series between said single resistor and a second reference voltage source.

10. Structure as in claim 9 wherein said second reference voltage source is ground.

11. Structure as in claim 4 wherein said at least one switching transistor is a bipolar transistor the collector of which is connected to one terminal of said capacitor and the emitter of which is connected to the other terminal of said capacitor.

12. Structure as in claim 11 wherein the emitter of said bipolar transistor is connected to a second reference voltage source.

13. Structure as in claim 12 wherein said second reference voltage source is ground.

14. A method for measuring the value of an unknown voltage which comprises:

applying a time-varying current from a reference voltage source through a first resistor to a capacitor thereby to increase the voltage across said capacitor as a function of time;

measuring the time Tr required for the voltage across said capacitor to reach a selected voltage level when current from the reference voltage source is applied to said capacitor;

restoring the voltage across said capacitor to its initial state;

applying a time-varying current from an unknown voltage source through a second resistor, whose resistance is equal to that of said first resistor, to said capacitor thereby to increase the voltage across said capacitor as a function of time;

measuring the time Tb required for the voltage across said capacitor to reach said selected voltage level when current from the unknown voltage source is applied to said capacitor; and calculating the unknown voltage from the times Tr and Tb, wherein said step of applying a time-varying current from an unknown voltage source through a second resistor to said capacitor comprises:

drawing a current from said unknown voltage source through a third resistor, a fourth resistor, and a first transistor, thereby to create a voltage drop across said third resistor; and drawing said time-varying current from said unknown voltage source through a second transistor which is turned on in response to the voltage drop across said third resistor, said current from said unknown voltage source being passed through said second resistor to said capacitor.

15. A method for measuring the value of an unknown voltage which comprises:

applying a time-varying current from a reference voltage source through a first resistor to a capacitor thereby to increase the voltage across said capacitor as a function of time;

measuring the time Tr required for the voltage across said capacitor to reach a selected voltage level when current from the reference voltage source is applied to said capacitor;

restoring the voltage across said capacitor to its initial state;

applying a time-varying current from an unknown voltage source through a second resistor, whose resistance is equal to that of said first resistor, to said capacitor thereby to increase the voltage across said capacitor as a function of time;

measuring the time Tb required for the voltage across said capacitor to reach said selected voltage level when current from the unknown voltage source is applied to said capacitor; and calculating the unknown voltage from the times Tr and Tb, wherein said step of applying a time-varying current from a reference voltage source through a first resistor to said capacitor comprises:

drawing a current from said reference voltage source through a third resistor, a fourth resistor, and a first transistor, thereby to create a voltage drop across said third resistor; and drawing said time-varying current from said reference voltage source through a second transistor which is turned on in response to the voltage drop across said third resistor, said current from said reference voltage source being passed through said first resistor to said capacitor.

16. A method for measuring the value of an unknown voltage which comprises:

applying a time-varying current from a reference voltage source through a first resistor to a capacitor thereby to increase the voltage across said capacitor as a function of time;

measuring the time Tr required for the voltage across said capacitor to reach a selected voltage level when current from the reference voltage source is applied to said capacitor;

restoring the voltage across said capacitor to its initial state;

applying a time-varying current from an unknown voltage source through a second resistor, whose resistance is equal to that of said first resistor, to said capacitor thereby to increase the voltage across said capacitor as a function of time;

measuring the time Tb required for the voltage across said capacitor to reach said selected voltage level when current from the unknown voltage source is applied to said capacitor; and calculating the unknown voltage from the times Tr and Tb, wherein said step of applying a time-varying current from an unknown voltage source through said second resistor to said capacitor thereby to increase the voltage across said capacitor as a function of time comprises:

passing said time-varying current from said unknown voltage source through a P-channel transistor and an N-channel transistor connected in parallel between said unknown voltage source and said second resistor and then through said second resistor to said capacitor.

17. A method for measuring the value of an unknown voltage which comprises:

applying a time-varying current from a reference voltage source through a first resistor to a capacitor thereby to increase the voltage across said capacitor as a function of time;

measuring the time Tr required for the voltage across said capacitor to reach a selected voltage level when current from the reference voltage source is applied to said capacitor;

restoring the voltage across said capacitor to its initial state;

applying a time-varying current from an unknown voltage source through a second resistor, whose resistance is equal to that of said first resistor, to said capacitor thereby to increase the voltage across said capacitor as a function of time;

measuring the time Tb required for the voltage across said capacitor to reach said selected voltage level when current from the unknown voltage source is applied to said capacitor; and calculating the unknown voltage from the times Tr and Tb, wherein said step of applying a time-varying current from a reference voltage source through said first resistor to said capacitor thereby to increase the voltage across said capacitor as a function of time comprises:

passing said time-varying current from said reference voltage source through a P-channel transistor and an N-channel transistor connected in parallel between said reference voltage source and said first resistor and then through said first resistor to said capacitor.

* * * * *